United States Patent
Agnello et al.

(10) Patent No.: US 7,358,166 B2
(45) Date of Patent: Apr. 15, 2008

(54) RELAXED, LOW-DEFECT SGOI FOR STRAINED SI CMOS APPLICATIONS

(75) Inventors: Paul D. Agnello, Wappingers Falls, NY (US); Stephen W. Bedell, Wappingers Falls, NY (US); Robert H. Dennard, New Rochelle, NY (US); Anthony G. Domenicucci, New Paltz, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 11/208,359

(22) Filed: Aug. 19, 2005

(65) Prior Publication Data

US 2006/0030133 A1 Feb. 9, 2006

Related U.S. Application Data

(62) Division of application No. 10/300,189, filed on Nov. 20, 2002, now Pat. No. 6,946,373.

(51) Int. Cl.
*H01L 21/205* (2006.01)
*H01L 21/477* (2006.01)

(52) U.S. Cl. ............... 438/509; 438/795; 257/E21.102; 257/E21.497

(58) Field of Classification Search ............... 438/480, 438/481, 489, 495, 506; 257/E21.102, E21.497
See application file for complete search history.

(56) References Cited

U.S. PATENT DOCUMENTS

| 5,461,243 A | 10/1995 | Ek et al. |
| 5,847,419 A | 12/1998 | Imai et al. |
| 5,891,769 A | 4/1999 | Liaw et al. |

(Continued)

OTHER PUBLICATIONS

H. Yin, et al., "Strained relaxation of SiGe islands on compliant oxide", Journal of Applied Physics, vol. 91, No. 12, Jun. 15, 2002, pp. 9716-9722.

(Continued)

*Primary Examiner*—Carl Whitehead, Jr.
*Assistant Examiner*—Jennifer M. Dolan
(74) *Attorney, Agent, or Firm*—Scully, Scott, Murphy & Presser, P.C.; Robert M. Trepp, Esq.

(57) ABSTRACT

Thermal mixing methods of forming a substantially relaxed and low-defect SGOI substrate material are provided. The methods include a patterning step which is used to form a structure containing at least SiGe islands formed atop a Ge resistant diffusion barrier layer. Patterning of the SiGe layer into islands changes the local forces acting at each of the island edges in such a way so that the relaxation force is greater than the forces that oppose relaxation. The absence of restoring forces at the edges of the patterned layers allows the final SiGe film to relax further than it would if the film was continuous.

23 Claims, 6 Drawing Sheets

U.S. PATENT DOCUMENTS

| | | |
|---|---|---|
| 6,326,667 B1 | 12/2001 | Sugiyama et al. |
| 6,369,438 B1 | 4/2002 | Sugiyama et al. |
| 6,583,000 B1 | 6/2003 | Hsu et al. |
| 6,680,240 B1 | 1/2004 | Maszara |
| 6,746,902 B2 | 6/2004 | Maa et al. |
| 2003/0013305 A1 | 1/2003 | Sugli et al. |
| 2004/0067644 A1 | 4/2004 | Malik et al. |

OTHER PUBLICATIONS

T. Tezuka, et al., "Dislocation-free formation of relaxed SiGe-on-insulator layers", Applied Physics Letters, vol. 80, No. 19, May 13, 2002, pp. 3560-3562.

US 7,358,166 B2

RELAXED, LOW-DEFECT SGOI FOR STRAINED SI CMOS APPLICATIONS

RELATED APPLICATIONS

This application is a divisional of U.S. application Ser. No. 10/300,189, filed Nov. 20, 2002 now U.S. Pat. No. 6,946,373.

FIELD OF THE INVENTION

The present invention relates to a method of fabricating a semiconductor substrate material, and more particularly to a method of fabricating a substantially relaxed, low-defect SiGe-on-insulator (SGOI) substrate material. The present invention also relates to a SGOI substrate material having the above-mentioned properties as well as structures that include at least the inventive SGOI substrate material.

BACKGROUND OF THE INVENTION

In the semiconductor industry, there has been a high-level of activity using strained Si-based heterostructures to achieve high carrier mobility structures for complementary metal oxide semiconductor (CMOS) applications. Traditionally, to boast performance of NFET and PFET devices, the prior art method to implement this has been to grow strained layers on thick (on the order of from about 1 to about 5 micrometers) relaxed SiGe buffer layers.

Despite the high channel electron mobilities reported for prior art heterostructures; the use of thick SiGe buffer layers has several noticeable disadvantages associated therewith. First, thick SiGe buffer layers are not typically easy to integrate with existing Si-based CMOS technology. Second, the defect density, including threading dislocations (TDs) and misfit dislocations, are from about $10^6$ to about $10^8$ defects/cm$^2$ which are still too high for realistic VLSI (very large scale integration) applications. Thirdly, the nature of the prior art structures precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used in an attempt to increase the length of the misfit dislocation section in the structures and thereby to decrease the TD density.

When a typical prior art metastable strained SiGe layer is annealed at a sufficiently high temperature, misfit dislocations will form and grow thereby relieving the total strain on the film. In other words, the initial elastic strain of the film is relieved by the onset of plastic deformation of the crystal lattice. For the case of prior art metastable strained SiGe grown on SOI substrates, experiments have shown that under most annealing/oxidation conditions, the formation of misfit dislocations occurs early in the annealing history for temperatures greater than ~700° C. Many of these defects are then either consumed or annihilated during the high-temperature annealing of the structure, however, the surface topography of the original misfit array persists during oxidation.

Furthermore, prior art methods of fabricating SGOI substrate materials by thermal diffusion do not completely relax the SiGe alloy layer. Instead, the final SiGe lattice expands only to some fraction of the equilibrium value because for any given small value of SiGe film trying to relax during oxidation, there are adjacent volumes on all sides which exert a force opposing that of relaxation. For example, it has been observed that when one uses the prior art thermal mixing approach to form SGOI substrate materials, under certain conditions the relaxation of the final SiGe alloy saturates at a value between 40 and 70% for a particular SOI starting wafer and an initial SiGe alloy layer.

This saturation suggests that an equilibrium condition is reached between the strain-relieving mechanisms and the elastic energy that persists within the partially relaxed, compressively strained SGOI material. In order for a compressively strained layer to completely relax elastically (without defect formation), the lateral (i.e., parallel to the substrate surface) dimensions of the film must, in some way, increase. To date, the prior art does not provide any means of increasing the lateral dimensions of the SiGe alloy film such that the force of relaxation is greater than the forces opposing relaxation.

In view of the problems mentioned above with prior art processes of fabricating a substantially relaxed SGOI substrate material, there is a continued need for providing a new and improved method that allows for formation of a substantially relaxed, single crystal SiGe buffer layer for a SOI substrate. The terms "substantially relaxed" or "highly relaxed" denote a SGOI substrate wherein the final SiGe alloy is from about 50 to about 100% relaxed. Moreover, 100% relaxation denotes a SiGe layer having a (unstrained) diamond-cubic lattice with a lattice constant that is determined by the Ge fraction and which is the same in all three principal lattice directions.

SUMMARY OF THE INVENTION

One object of the present invention is to provide a method of fabricating a thin, high-quality SGOI substrate material.

Another object of the present invention is to provide a method of fabricating a thin, high-quality SGOI substrate material that has a substantially high degree of relaxation associated therewith (50% or greater).

A further object of the present invention is to provide a method of fabricating a thin, high-quality SGOI substrate material that has substantially little or no surface artifacts, i.e., defects, associated therewith.

A yet further object of the present invention is to provide a method of fabricating a thin, high-quality SGOI substrate material that has a significantly lower density of crystal defects associated therewith.

An even further object of the present invention is to provide a method of fabricating a thin, high-quality SGOI substrate material which utilizes processing steps that are compatible with complementary metal oxide semiconductor (CMOS) processing steps.

An additional object of the present invention is to provide a method of fabricating a thin, high-quality, substantially relaxed SGOI substrate material which can be used as a lattice mismatch template, i.e., substrate, in forming strained Si layers.

A yet additional object of the present invention is to provide strained Si/substantially relaxed SGOI structures that have high carrier mobility which are useful in high-performance CMOS applications.

These and other objects and advantages are achieved in the present invention by utilizing a method wherein a patterning step is used to form a structure containing islands of single-crystal Si and strained SiGe alloy or islands of a partially relaxed SiGe layer atop a Ge diffusion barrier layer. Patterning of the Si and SiGe layers into islands changes the local forces acting at each of the island edges in such a way so that the relaxation force is greater than the forces that oppose relaxation. The absence of restoring forces at the edges of the patterned layers allows the final SiGe film to relax further than it would if the film was continuous.

The Ge diffusion barrier layer can serve as a viscous medium upon which lateral motion of the film island can occur, but only if the length scale of the island is small enough. How small is "small enough" will depend on the thickness of the relaxing film, the integrated lateral stress acting at the interface and the mechanical properties of the material. The temperature at which lateral expansion of the SiGe island can occur is determined by the visco-elastic properties of the buried Ge barrier layer. Namely, the temperature at which the Ge diffusion resistant barrier layer behaves viscously (it flows). This can be controlled by introducing dopants into the Ge barrier layer by ion-implantation. Implantation of boron into the Ge barrier layer, for example, could be used to lower the temperature at which strain relaxation of the islands takes place.

The concept of enhanced relaxation of patterned islands could also be extended to high-temperature, in-situ selective growth of SiGe alloy layers directly on Si islands formed by patterning of a (initially) continuous, thin Si-on-insulator layer. The in-situ relaxed SiGe islands can then serve as lattice templates for selective Si growth that will result in tensile strain in the Si layer. A selective epitaxial Si growth process could also be used to grow the strained silicon layer onto the relaxed SiGe islands.

One method of the present invention employed in forming the substantially relaxed, low defect SGOI substrate material includes the steps of:

forming a $Si_xGe_{1-x}$ layer, wherein x=0 or a number less than 1, on a surface of a first single crystal Si layer, said first single crystal Si layer has an interface with an underlying barrier layer that is resistant to Ge diffusion;

patterning said $Si_xGe_{1-x}$ layer and said first single crystal Si layer to provide a patterned structure; and heating said patterned structure at a temperature which permits relaxation of strain within the patterned layers and subsequent interdiffusion of Ge throughout the patterned first single crystal Si layer and the patterned $Si_xGe_{1-x}$ layer to form a substantially relaxed, single crystal SiGe layer atop a portion of the barrier layer.

In another method of the present invention, the following steps are employed:

forming a $Si_xGe_{1-x}$ layer, wherein x=0 or a number less than 1, on a surface of a first single crystal Si layer, said first single crystal Si layer has an interface with an underlying barrier layer that is resistant to Ge diffusion;

first heating said layers at a temperature which permits interdiffusion of Ge throughout the first single crystal Si layer and the $Si_xGe_{1-x}$ layer to form either a partially relaxed or fully-strained, single crystal SiGe layer atop the barrier layer;

patterning the single crystal SiGe layer; and second heating the single crystal SiGe layer at a temperature which permits complete relaxation of the single crystal SiGe layer to form a substantially relaxed, single crystal SiGe layer atop a portion of the barrier layer.

A yet further method of the present invention employed in forming the substantially relaxed, low defect SGOI substrate material includes the steps of:

patterning a first single crystal Si layer into a predetermined geometric shape; and selectively growing an epitaxial SiGe layer about said geometric shape at a temperature which allows in-situ relaxation of said SiGe layer thereby forming a substantially relaxed SiGe region.

In the inventive methods mentioned above, the geometric shape of the patterned layer is typically a square or rectangle. The patterning serves to change the local forces acting at each of the island edges in such a way so that the relaxation force is greater than the forces that oppose relaxation. The absence of restoring forces at the edges of the patterned layers allows the final SiGe film to relax further than it would if the film was continuous. In addition to the enhanced relaxation of the SiGe layer, the final defect density is reduced because the islands are allowed to relax elastically (by lateral expansion on the oxide layer), rather than plastically (by introducing strain-relieving defects).

It is noted that the substantially relaxed, single crystal SiGe layer formed by either the above embodiments of the present invention is comprised of a homogeneous mixture of the $Si_xGe_{1-x}$ layer as well as the first single crystal Si layer. Moreover, the substantially relaxed, single crystal SiGe layer has minimized surface defects and a reduced density of crystal defects.

Following the above processing steps, a strained Si layer may be selectively grown epitaxially atop the substantially relaxed, single crystal SiGe layer to form a strained-Si/substantially relaxed SiGe-containing heterostructure that can be used in a variety of high-performance CMOS applications.

In some applications of the present invention, the first single crystal Si layer and the barrier layer are components of a silicon-on-insulator (SOI) substrate. In other applications, the barrier layer is formed atop a surface of a semiconductor substrate, and thereafter the first single crystal Si layer is formed atop the barrier layer. The latter substrate material is a non-SOI substrate.

In another application of the present experiment, the first single crystal Si layer is a very thin layer having a thickness of about 50 nm or less. The use of a thin starting single crystal layer is useful in minimizing the amount of oxidation required to form the final SGOI thickness and Ge concentration. This is useful in situations where oxidation of the exposed sidewalls of the patterned islands must be minimized.

The present methods also contemplate the use of Ge barrier layers that are unpatterned (i.e., barrier layers that are continuous) or patterned (i.e., discrete and isolated barrier regions or islands which are surrounded by semiconductor material).

In yet another application of the present invention, a Si cap layer is formed atop the $Si_xGe_{1-x}$ alloy layer prior to heating the structure. This embodiment of the present invention provides thermodynamically stable (in terms of preventing defect production) thin, substantially relaxed SiGe-on-insulator, SGOI, substrate materials. It is noted that the term "thin" when used in conjunction with the high-quality, substantially relaxed SiGe-on-insulator substrate material, denotes that the homogenized SiGe layer formed via the inventive methods has a thickness of about 2000 nm or less, with a thickness of from about 10 to about 200 nm being more highly preferred.

Another aspect of the present invention relates to the SiGe-on-insulator substrate material that is formed utilizing the above-mentioned methods. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less, a measured relaxation value of about 50% or greater, substantially little or no surface defects, and a crystal defect density of about $5 \times 10^6/cm^2$ or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate; a substantially relaxed SiGe layer present atop the insulating region, wherein the substantially relaxed SiGe layer has a thickness of about 2000 nm or less, a measured relaxation value of about 50% or greater, substantially little or no surface defects, and a crystal defect density of about $5 \times 10^6/cm^2$ or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
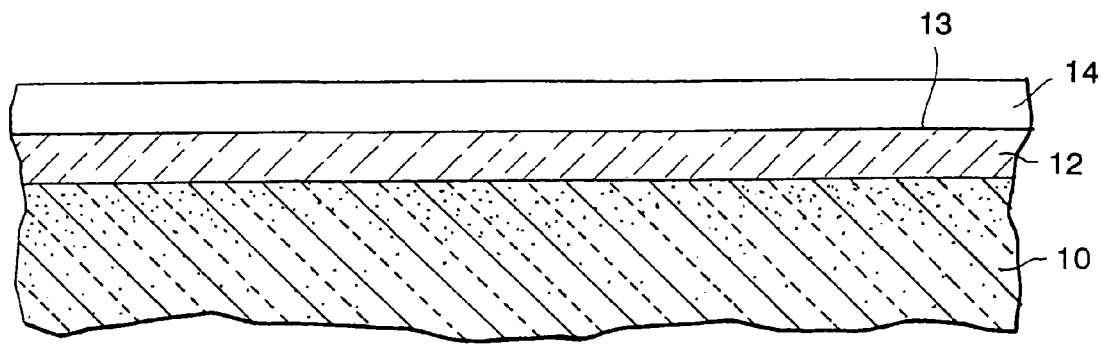
FIGS. 1A-1F are pictorial representations (through cross-sectional views) showing the basic processing steps of a first embodiment of the present invention which is used in fabricating a highly-relaxed, low-defect SGOI substrate material.

The present invention, which provides methods of fabricating improved thin, high-quality, highly-relaxed SiGe-on-insulator substrate materials which can then serve as a lattice mismatched template for subsequent overgrowth of epitaxial Si, will now be described in greater detail by referring to the drawings that accompany the present application. It is noted that in the accompanying drawings like and/or corresponding elements are referred to by like reference numerals.

Figure 1B:
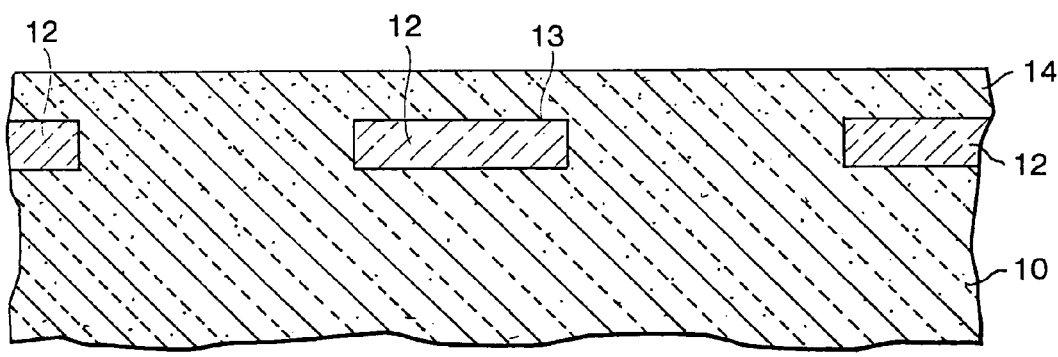

Reference is first made to FIG. 1A and FIG. 1B which show two different types of initial substrate materials that can be employed in the present invention. Specifically, the initial substrate materials illustrated in FIGS. 1A-1B comprise Si-containing semiconductor substrate 10, barrier layer 12 which is resistant to Ge diffusion (hereinafter "barrier layer") present atop a surface of Si-containing semiconductor substrate 10 and first single crystal Si layer 14 having misfit and TD densities of less than about $1 \times 10^5$ defects/$cm^2$ present atop the barrier layer. The difference between the two initial structures depicted in the drawings is that, in FIG. 1A, the barrier layer is present continuously throughout the entire structure, whereas in FIG. 1B, the barrier layer is present as discrete and isolated regions or islands that are surrounded by semiconductor material, i.e., layers 10 and 14. Note that the initial structure shown in FIG. 1A thus includes an unpatterned barrier layer, whereas the initial structure of FIG. 1B includes a patterned barrier layer.

Notwithstanding whether the barrier layer is patterned or unpatterned, the initial structure may be a conventional silicon-on-insulator (SOI) substrate material wherein region 12 is a buried oxide (BOX) region which electrically isolates first single crystal Si layer 14 from Si-containing semiconductor substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and pre-formed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well-known to those skilled in the art, as well as the various SIMOX processes mentioned in co-assigned U.S. patent applications Ser. Nos. 09/861,593, filed May 21, 2001; 09/861,594, filed May 21, 2001; 09/861,590, filed May 21, 2001; 09/861,596, filed May 21, 2001; and 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate the patterned substrate shown in FIG. 1B.

Alternatively, the SOI substrate material may be made using other conventional processes including, for example, a thermal bonding and cutting process.

In addition to SOI substrates, the initial substrates shown in FIGS. 1A and 1B may be a non-SOI substrate which is made using conventional deposition processes as well as lithography and etching (employed when fabricating a patterned substrate). Specifically, when non-SOI substrates are employed, the initial structure is formed by depositing a Ge diffusion barrier layer atop a surface of a Si-containing substrate, via conventional deposition or thermal growing processes, optionally patterning the barrier layer by employing conventional lithography and etching; and thereafter forming a single crystal Si layer atop the barrier layer using conventional deposition processes including, for example, chemical vapor deposition (CVD), plasma-assisted CVD, sputtering, evaporation, chemical solution deposition or epitaxial Si growth.

Barrier layer 12 of the initial structure shown in FIGS. 1A and 1B comprises any insulating material which is highly resistant to Ge diffusion. Examples of such insulating and Ge diffusion resistant materials include, but are not limited to: crystalline or non-crystalline oxides or nitrides.

The thickness of the various layers of the initial structure may vary depending on the process used in making the same. Typically, however, single crystal Si layer 14 has a thickness of from about 1 to about 2000 nm, with a thickness of from about 10 to about 200 nm being more highly preferred. In the case of barrier layer 12 (i.e., Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention. It is noted that the thicknesses provided above are exemplary and by no ways limit the scope of the present invention.

For simplicity, the remaining steps of the present invention will make use of the initial structure shown in FIG. 1A. The remaining steps however work well with the initial structure shown in FIG. 1B.

Figure 1C:
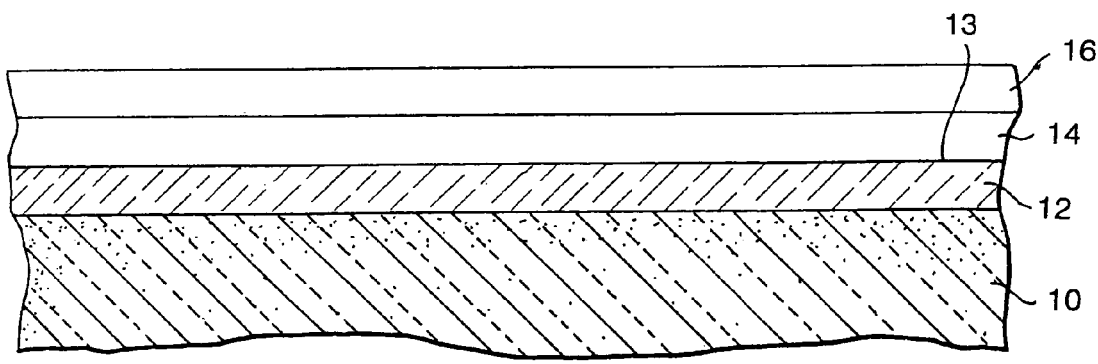

FIG. 1C illustrates the structure that is formed after $Si_xGe_{1-x}$ layer 16 (wherein x is 0 or a number less than 1) is formed atop first single crystal Si layer 14. The "$Si_xGe_{1-x}$" layer is hereinafter referred to as a SiGe alloy layer. The SiGe alloy layer of the present invention may comprise SiGe alloys having up to 99.99 atomic percent Ge (when x is less than 1), as well as pure Ge (when x=0) that comprise 100 atomic percent Ge. In one embodiment of the present invention, it is preferred that the Ge content in the SiGe alloy layer be from about 0.1 to about 99.9 atomic percent, with a Ge atomic percent of from about 10 to about 35 being even more highly preferred. In the drawings, reference numeral 13 denotes the interface between barrier layer 12 and single crystal Si layer 14.

In accordance with the present invention, the SiGe alloy is formed atop first single crystal Si layer 14 using a conventional epitaxial growth method that is well-known to those skilled in the art which is capable of (i) growing a thermodynamically stable (below a critical thickness) SiGe alloy, or (ii) growing a SiGe alloy layer that is metastable and free from defects, i.e., misfit and TD dislocations. Illustrative examples of such epitaxial growing processes that are capable of satisfy conditions (i) or (ii) include, but are not limited to: low-pressure chemical vapor deposition (LPCVD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

The thickness of the SiGe alloy layer formed at this point of the present invention may vary, but typically layer 16 has a thickness of from about 10 to about 500 nm, with a thickness of from about 20 to about 200 nm being more highly preferred.

Figure 2A:
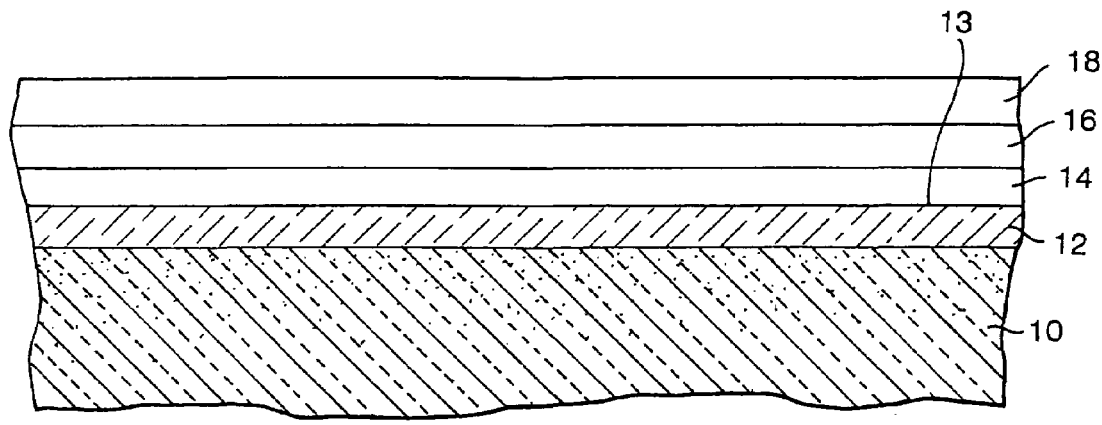
FIGS. 2A-2B are pictorial representations (through cross-sectional views) showing an alternative embodiment of the present invention wherein a Si cap layer is formed atop a SiGe alloy layer which is present on an unpatterned (1A) or patterned (1B) substrate.
Figure 2B:
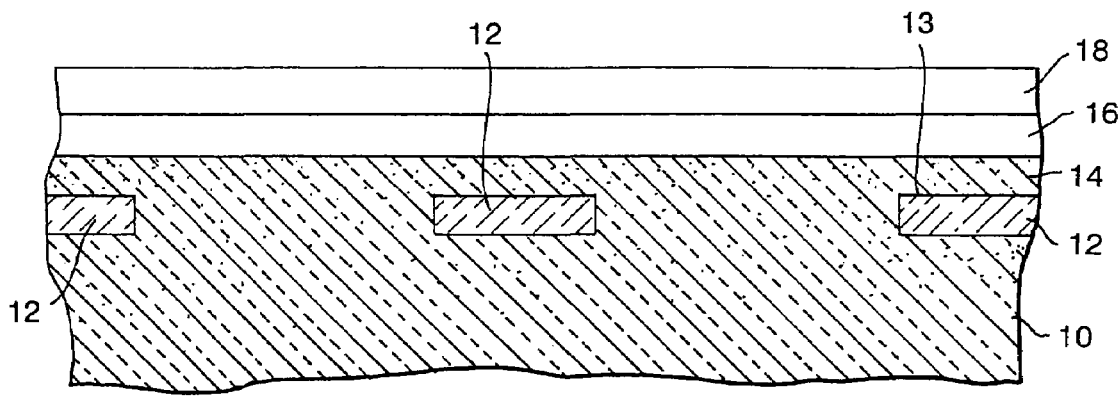

In one alternative embodiment of the present invention, see FIG. 2A-2B, optional cap layer 18 is formed atop SiGe alloy layer 16 prior to performing the heating step of the present invention. The optional cap layer employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si. It is noted that layers 16 and 18 may, or may not, be formed in the same reaction chamber.

When present, optional cap layer 18 has a thickness of from about 1 to about 100 nm, with a thickness of from about 1 to about 30 nm being more highly preferred. The optional cap layer is formed utilizing any well-known deposition process including the epitaxial growth processes mentioned above.

In one embodiment of the present invention, it is preferred to form a SiGe alloy (15 to 20 atomic percent Ge) layer having a thickness of from about 1 to about 200 nm on the surface of a single crystal Si layer, and thereafter forming a Si cap layer having a thickness of from about 1 to about 100 nm atop the SiGe alloy layer.

Figure 1D:
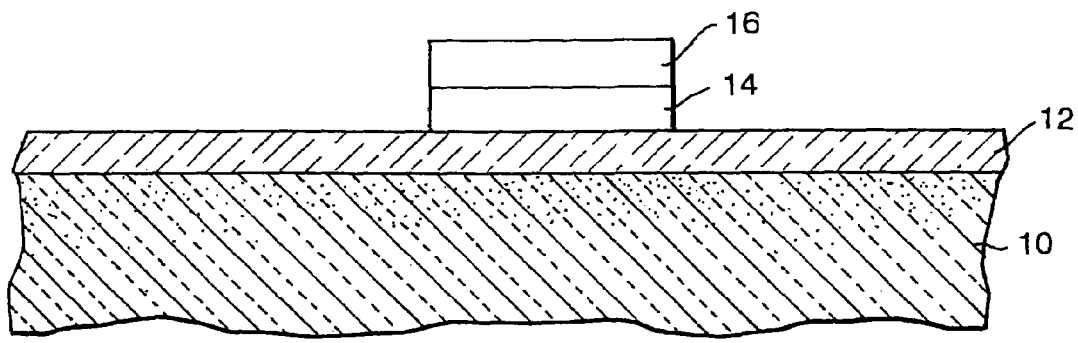

Next, the structure, with or without the optional Si cap layer, is then patterned so as to provide the structure illustrated in FIG. 1D. Specifically, the structure, with or without the optional Si cap layer, is patterned by using conventional lithography and etching. The lithography step includes applying a photoresist (not shown) to the surface of the structure, either atop the SiGe alloy layer or the optional Si cap layer, exposing the photoresist to a pattern of radiation, and developing the pattern into the photoresist by utilizing a conventional resist developer. Note that the patterned photoresist protects portions of the structure, while leaving other portions of the structure exposed. With the patterned photoresist in place, the exposed portions of the structure are then etched stopping atop barrier layer 12. In some embodiments, the etching step thus removes exposed portions of the SiGe alloy layer as well as the single crystal Si layer underlying the exposed portions of the SiGe alloy, while in other embodiments, the optional Si cap is first etched and thereafter the underlying SiGe alloy and single crystal Si layers may be removed.

The etching step may be carried out using a single etching step, or multiple etching steps may be employed in forming the structure shown, for example, in FIG. 1D. Notwithstanding whether a single- or multiple-etching process is performed, etching may be performed using a conventional dry etching process such as, reactive-ion etching, plasma etching, ion beam etching, laser ablation or any combination thereof. In addition to dry etching, the present invention also contemplates that this etching step may include the use of a wet chemical etching process or a combination of wet etching and dry etching may be performed. When wet chemical etching is utilized, a chemical etching that is highly selective in removing Si as compared to oxide or nitride is employed. Following etching the patterned photoresist is removed at this point of the inventive process utilizing a conventional resist stripping process.

The patterned layers of SiGe layer 16, Si layer 14 and, if present, optional Si cap layer 18 are referred to herein as an island. It is noted that although the drawings depict the formation of a single island structure, the present invention also contemplates the formation of a multitude of such island structures on the surface of barrier layer 12. The islands are generally small in size, having a lateral width of about 500 μm or less. More preferably, the patterned islands have a lateral width of from about 0.01 to about 100 μm. It should be noted that the width of the islands formed by the present invention must be sufficient to permit relaxation of the SiGe film by ensuring that the forces of relaxation in the island regions outweigh the forces that oppose relaxation.

In some embodiments, the optional Si cap layer may be formed atop the patterned surface of SiGe alloy layer 16 at this point of the present invention. This embodiment of the present invention is not specifically illustrated in the present invention.

Figure 1E:
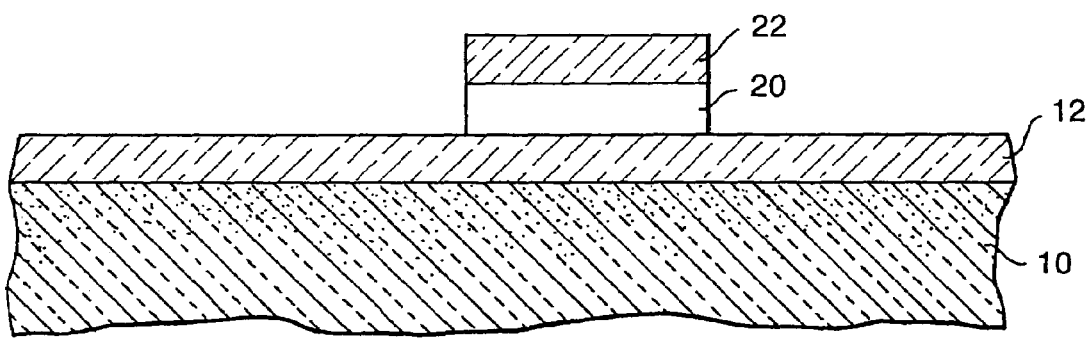

The patterned structure containing the above-mentioned islands is then heated, i.e., annealed, at a temperature which permits relaxation of the strained SiGe alloy layer and subsequent interdiffusion of Ge throughout first single crystal Si layer 14, SiGe alloy layer 16 and, if present, the optional Si cap thereby forming substantially relaxed, single crystal SiGe layer 20 atop the barrier layer (See FIG. 1E). The relaxation anneal may be performed separately from the interdiffusion anneal or combined in one annealing process. The heating can be performed in a tube furnace or using rapid-thermal annealing (RTA) tools. Note that oxide layer 22 is formed atop layer 20 during the heating step. This oxide layer is typically, but not always, removed from the structure after the heating step using a conventional wet etch process wherein a chemical etchant such as HF that has a high selectivity for removing oxide as compared to SiGe is employed. Alternatively, this oxide layer may be removed using a conventional dry etching process such as reactive-ion etching.

Note that when the oxide layer is removed, a second single crystal Si layer can be formed atop layer 20 and the above processing steps of the present invention may be repeated any number of times to produce a multilayered relaxed SiGe substrate material.

The oxide layer formed after the heating step of the present invention has a variable thickness which may range from about 2 to about 2000 nm, with a thickness of from about 2 to about 500 nm being more highly preferred.

Specifically, the heating step of the present invention is an annealing step which is performed at a temperature of from about 900° to about 1350° C., with a temperature of from about 1200° to about 1335° C. being more highly preferred. Moreover, the heating step of the present invention can be carried out in an oxidizing ambient which may include at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time which typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

The heating step can be performed under an oxidizing ambient to achieve the presence of a surface oxide layer, i.e., layer 22, which acts as a diffusion barrier to Ge atoms. Therefore, once the oxide layer is formed on the surface of the structure, Ge becomes trapped between barrier layer 12 and oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature of from about 1200° to about 1320° C. in a diluted oxygen-containing gas.

It is also contemplated herein to use a tailored heat cycle which is based upon the melting point of the SiGe alloy layer. In such an instance, the temperature is adjusted to tract below the melting point of the SiGe alloy layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is (1) to allow Ge atoms to diffuse more quickly thereby maintaining a homogeneous distribution during annealing; and (2) to subject the ('initially') strained layer structure to a thermal budget which will facilitate an equilibrium configuration. After this heating step has been performed, the structure includes a uniform and substantially relaxed SiGe alloy layer, i.e., layer 20, sandwiched between barrier layer 12 and surface oxide layer 22.

The heating step can also be performed in a non-oxidizing ambient. In this case, the anneal would simply homogenize the Ge throughout the first single crystal Si and the SiGe layers. This would be preferred in the situation where the lateral dimensions patterned islands were very small and oxidation of the structure might consume the island by lateral oxidation of the sidewalls.

In accordance with the present invention, substantially relaxed SiGe layer 20 has a thickness of about 2000 nm or less, with a thickness of from about 10 to about 200 nm being more highly preferred. Note that the substantially relaxed SiGe layer formed in the present invention is thinner than prior art SiGe buffer layers and has a defect density including misfits and TDs, of about $5 \times 10^6$ defects/cm$^2$ or less.

The substantially relaxed SiGe layer formed in the present invention has a final Ge content of from about 0.1 to about 99.9 atomic percent, with an atomic percent of Ge of from about 10 to about 35 being more highly preferred. Another characteristic feature of substantially relaxed SiGe layer 20 is that it has a measured lattice relaxation of from about 50% or greater, with a measured lattice relaxation of from about 75 to about 100% being more typically preferred. It is noted that 100% relaxation is most preferred in the present invention.

Figure 1F:
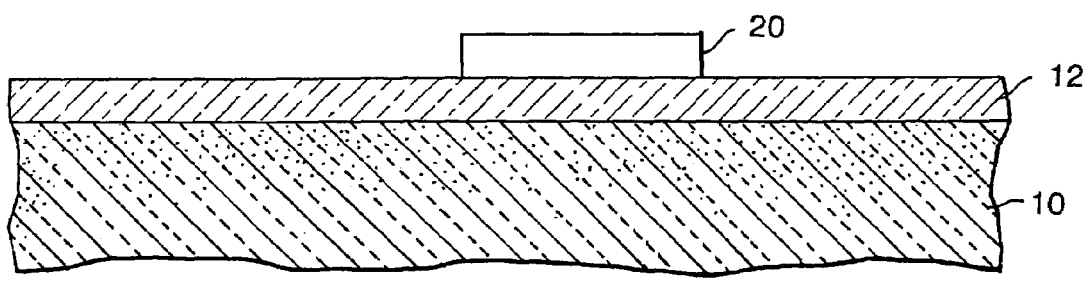

As stated above, surface oxide layer 22 may be stripped at this point of the present invention so as to provide the SiGe-on-insulator substrate material shown, for example, in FIG. 1F.

The above discussion, with illustration to FIGS. 1A-1F, are representative of the first embodiment of the present invention. The second embodiment, which includes a partial relaxation heating step prior to patterning will be now described in more detail, with reference to FIGS. 3A-3F.

Figure 3A:
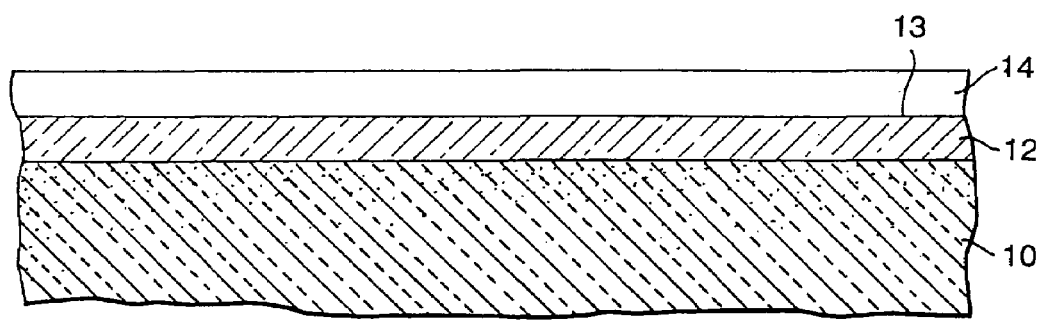
FIG. 3A-3F are pictorial representations (through cross-sectional views) showing the basic processing steps of a second embodiment of the present invention which is used in fabricating a highly-relaxed, low-defect SGOI substrate material.

FIG. 3A shows an initial structure (including Ge barrier layer 12 sandwiched between single crystal Si layer 14 and Si-containing substrate 10) that is employed in the second embodiment of the present invention. Note that the structure shown in FIG. 3A is identical to that shown in FIG. 1A. In addition to utilizing this specific initial structure, the structure illustrated in FIG. 1B may also be employed.

Figure 3B:
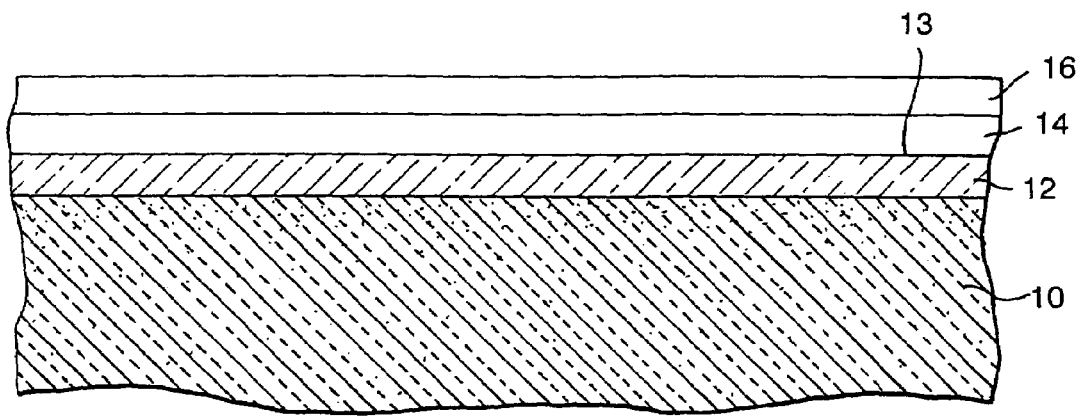

Next, SiGe alloy layer 16 is formed atop first single crystal Si layer 14 using the processing steps mentioned above so as to provide the structure shown in FIG. 3B. At this point of the inventive process, optional Si cap layer 18 may be formed atop the SiGe alloy layer and thereafter the structure, with or without the optional Si cap layer, is subjected to a first heating step which is performed at a temperature which permits interdiffusion of Ge throughout the first single crystal Si layer and the $Si_xGe_{1-x}$ layer to form either partially relaxed or fully-strained, single crystal SiGe layer 19 atop barrier layer 12. The first heating step of the present invention is carried out at a temperature of from about 900° to about 1335° C., with a temperature of from about 1150° to about 1320° C. being more highly preferred.

Moreover, the first heating step of the present invention is carried out in an oxidizing ambient which includes at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. The first heating step may be carried out for a variable period of time which typically ranges from about 10 to about 1800 minutes, with a time period of from about 60 to about 600 minutes being more highly preferred. The first heating step may be carried out at a single targeted temperature, or various ramp and soak cycles using various ramp rates and soak times can be employed.

Figure 3C:
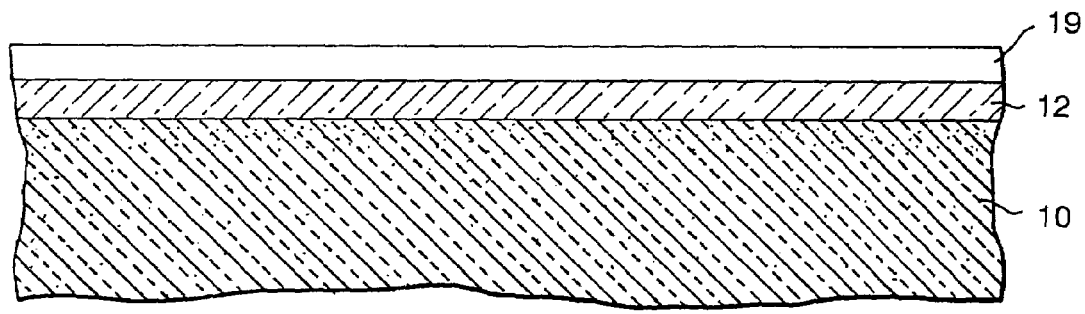

The structure formed after the first heating step is shown, for example, in FIG. 3C. Note that the first heat step forms either partially relaxed or fully-strained SiGe layer 19 atop the surface of barrier layer 12. It is also noted that a thin oxide layer typically begins to form atop the partially relaxed SiGe layer at this point of the present invention. For clarity, however, this thin oxide layer has be omitted from the drawings.

Figure 3D:
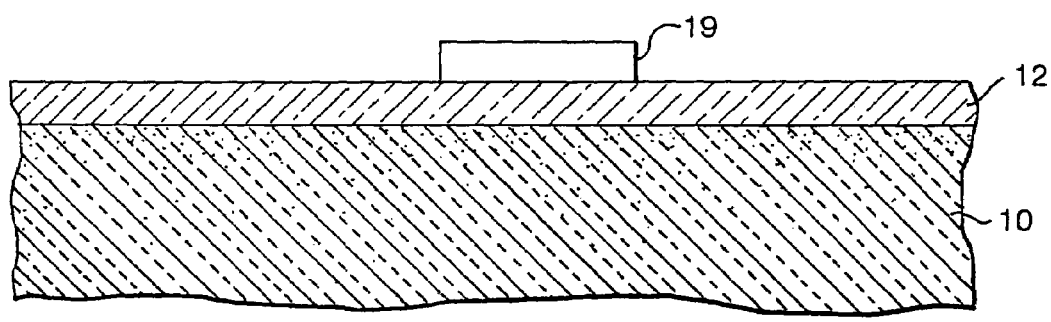
Figure 3E:
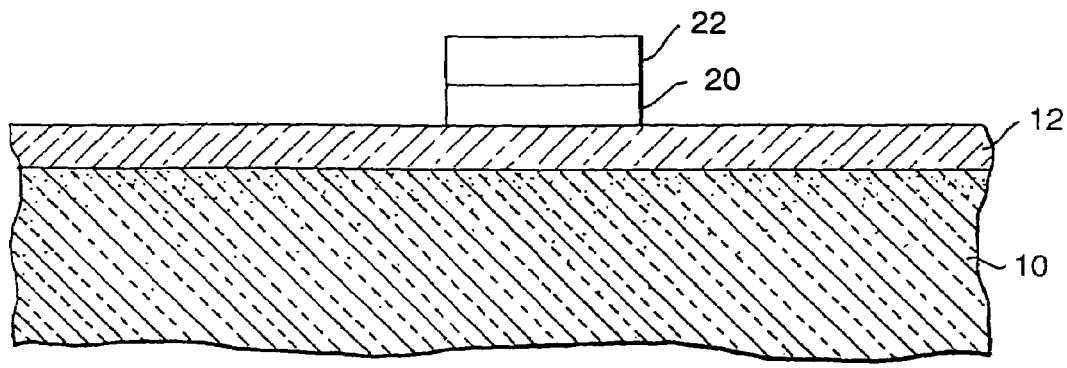

Next, SiGe layer 19 is then patterned as discussed to provide the patterned structure shown in FIG. 3D. The SiGe islands formed have the same lateral width as mentioned above. After patterning, the structure shown in FIG. 3D is then subjected to a second heating step that is carried out at a temperature which permits further relaxation of the single crystal SiGe layer to form substantially relaxed, single crystal SiGe layer 20 atop a portion of the barrier layer, See FIG. 3E. Note the presence of oxide layer 22 atop the relaxed SiGe layer. The thickness of oxide layer 22 may be very thin (sub-nanometer) or thicker depending on the annealing ambient and temperature.

The second heating step of the present invention is carried out at a temperature of from about 900° to about 1335° C., with a temperature of from about 1150° to about 1320° C. being more highly preferred. Moreover, the second heating step of the present invention may be carried out in an oxidizing ambient which includes at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. The second heating step may also be carried out in a non-oxidizing ambient as well to minimize the consumption and distortion of the patterned islands. The second heating step may be carried out for a variable period of time which typically ranges from about 1 to about 1800 minutes, with a time period of from about 10 to about 600 minutes being more highly preferred. The second heating step may be carried out at a single targeted temperature, or various ramp and soak cycles using various ramp rates and soak times can be employed.

Figure 3F:
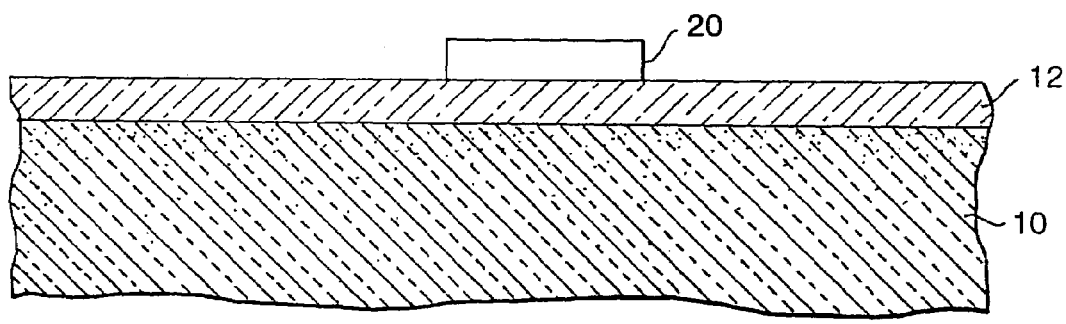
Figure 4:
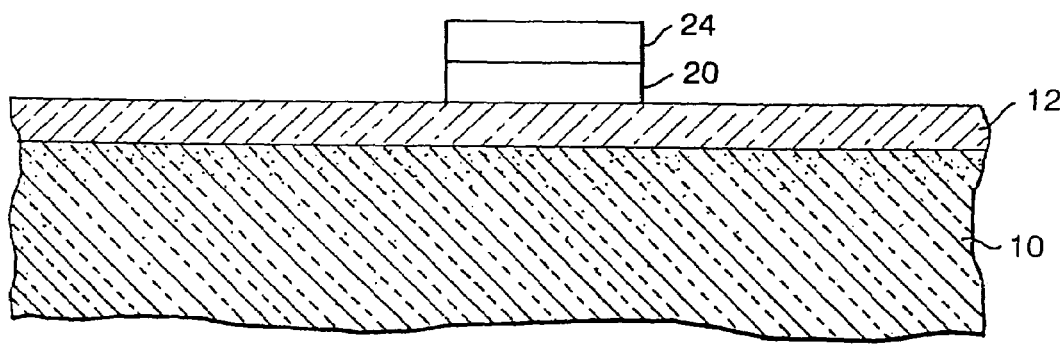
FIG. 4 is a structure that can be formed using the inventive SGOI substrate material.

FIG. 4 shows the structure that is obtained after forming Si layer 24 atop the SiGe layer of FIG. 1F or 3F. Specifically, Si layer 24 is formed using a selective epitaxial deposition process well-known in the art. The thickness of epi-Si layer 24 may vary, but typically, epi-Si layer 24 has a thickness of from about 1 to about 100 nm, with a thickness of from about 1 to about 30 nm being more highly preferred.

Figure 5A:
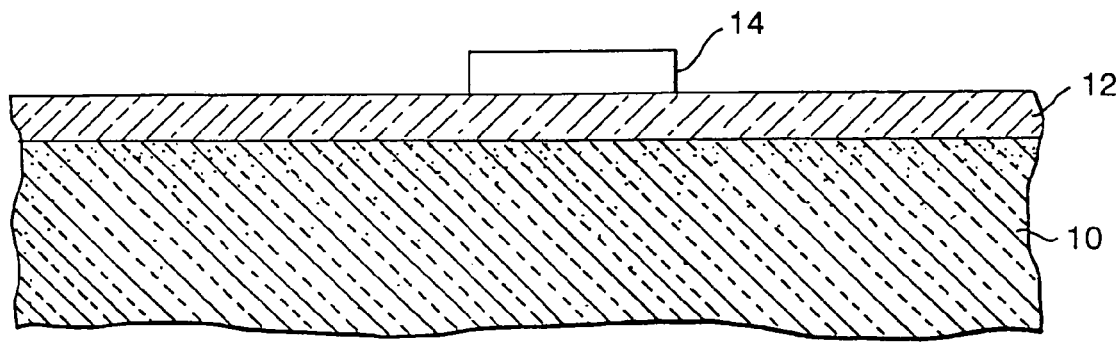
FIGS. 5A-5C are pictorial representations (through cross sectional views) showing the basic processing steps of a third embodiment of the present invention which is used in fabricating a highly-relaxed, low-defect SGOI substrate material.
Figure 5B:
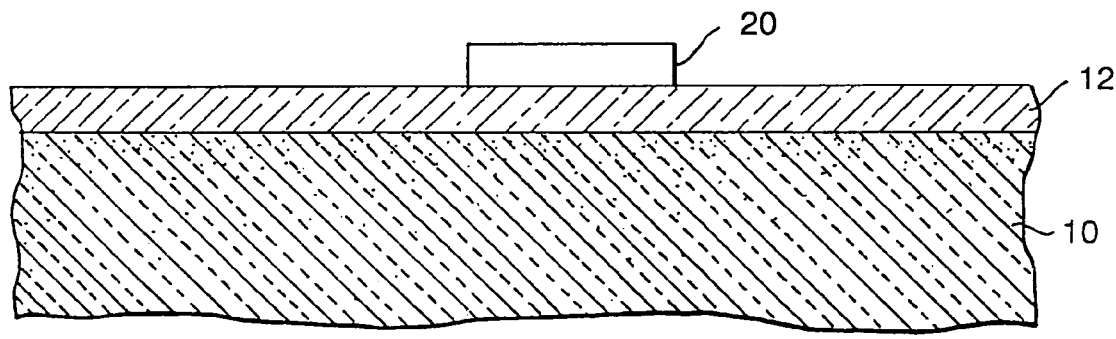
Figure 5C:
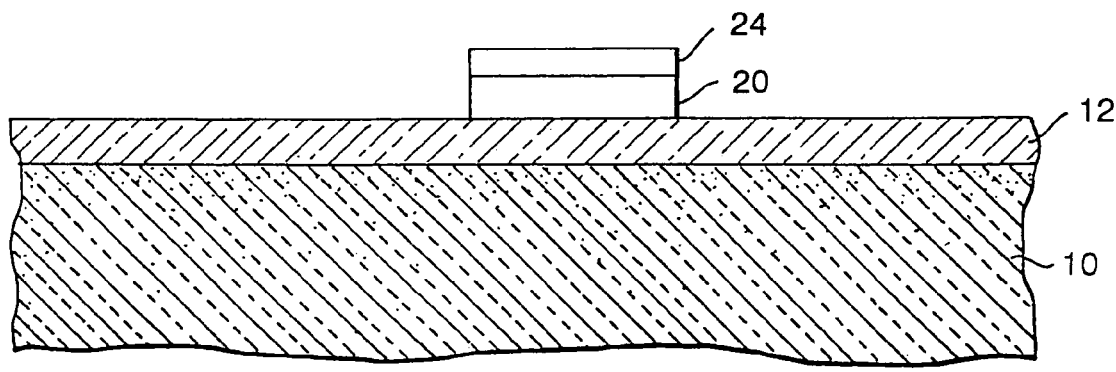

FIGS. 5A-5C show a third method of the present invention. In the third method, first single crystal Si layer 14 of an SOI wafer (also containing Ge barrier layer 12 and semiconductor substrate 10) is patterned via conventional lithography and etching to provide a structure containing a predetermined geometric shape as is shown, for example, in FIG. 5A. After patterning, epitaxial SiGe is selectively grown at a temperature which is sufficiently high enough to cause in-situ relaxation of the SiGe layer forming substantially relaxed SiGe region 20. See FIG. 5B The in-situ relaxation occurs utilizing a selective deposition process such as CVD wherein the temperature of deposition is about 600° C. or greater. Preferably, the in-situ relaxation occurs at a temperature of from about 800° to about 1100° C.

Note that SiGe region 20 has substantially the same geometric shape as patterned single crystal Si layer 14. FIG. 5C shows Si layer 24 being formed on the structure shown in FIG. 5B.

In some instances, additional SiGe can be formed atop relaxed SiGe layer 20 utilizing the above mentioned processing steps, and thereafter epi-Si layer 24 may be formed. Because layer 20 has a large in-plane lattice parameter as compared to epi-layer 24, epi-layer 24 will be strained in a tensile manner.

In either the first, second or third embodiment described above, boron or another like impurity ion may be implanted into the Ge barrier layer prior to heating the structure using a conventional ion implantation process well-known to those skilled in the art. The impurity ions are employed in the present invention to lower the temperature at which elastic relaxation can occur. Specifically, the implantation of impurity ions into the Ge barrier layer can lower the relaxation temperature as much as 300° C. or greater.

In either the first, second, or third embodiment described above, hydrogen ions can be implanted in such a way as to place the peak of the implanted ion distribution at or near the buried oxide/top Si interface. This can enhance the relaxation of the SiGe layer and can be used in conjunction with the patterning methods described here. The hydrogen ion implantation can be performed using the techniques and conditions disclosed in co-assigned U.S. application Ser. No. 10/196,611, filed Jul. 16, 2002, the entire content of which is incorporated herein by reference. In place of hydrogen, deuterium, helium, oxygen, neon and other like ions that are capable of forming defects that allow mechanical decoupling at or near the first single crystal Si/barrier layer interface can be employed. Mixtures of the above-mentioned ions are also contemplated herein. Preferred ions include hydrogen ions, and preferred conditions include: an ion concentration of below 3E16 atoms/cm$^2$ and an implant energy of from about 1 to about 100 keV. The ions can be implanted before or after patterning on any of the three embodiments mentioned above.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers of Si and SiGe formed atop the substantially relaxed SiGe layer of the substrate material.

In the case of lattice mismatched structures, GaAs, GaP or other like III/V compound semiconductors would be formed atop the substantially relaxed SiGe layer of the inventive SiGe-on-insulator substrate material.

The following example is provided to illustrate some of the advantages of the present invention over a conventional thermal mixing process.

EXAMPLE

An initial structure of 350 Å SIMOX SOI with a deposited epitaxial layer of 300 Å $Si_{0.8}Ge_{0.2}$ followed by a 200 Å Si "Cap" layer was thermally mixed at high temperatures (from 1200° to 1320° C.) and the (continuous) films were found not to relax. In other words, even though the Ge had been mixed throughout the layers, and concentrated by the process of oxidation, the SiGe film over the oxide had retained the in-plane lattice parameter of bulk Si. The elastic strain energy within this layer was below that required to relax plastically, i.e., by the formation of strain-relieving defects, and thus no relaxation occurred at all.

The same initial structure was used and patterned by removing regions of the original Si/SiGe/SOI film prior to heating thereby delineating islands of film. The size of the patterned islands varied from a few tenths to hundreds of microns on edge. The same heating procedure was carried out and the patterned structure was measured to be 87% relaxed as measured by X-ray diffraction (large beam size averaging over many feature sizes). Further investigation of individual structures using Plan-View Transmission Electron Microscopy (PV-TEM) (using Moire analysis) showed that islands up to about 10 µm on edge relaxed completely (100%), whereas larger structures relaxed partially or asymmetrically, depending on the size and shape of the island.

Another important feature of the elastic relaxation of SiGe islands using this procedure is the total absence of defects as measured by PV-TEM. No defects at all were found after scanning and sets the upper limit of defects at $<1\times10^5$ cm$^{-2}$. X-Ray analysis on thicker starting SiGe layers (600 Å-17% SiGe on 350 Å SIMOX SOI) showed 99% relaxation, indicating that thicker films indeed relax more.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a substantially relaxed, low-defect SGOI substrate material comprising the steps of:
   forming a $Si_xGe_{1-x}$ layer, wherein x=0 or a number less than 1, on a surface of a first single crystal Si layer, said first single crystal Si layer has an interface with an underlying barrier layer that is resistant to Ge diffusion;
   first heating said layers at a temperature which permits interdiffusion of Ge throughout the first single crystal Si layer and the $Si_xGe_{1-x}$ layer to form either a partially relaxed or fully-strained, single crystal SiGe layer atop the barrier layer;
   patterning the single crystal SiGe layer to provide a single crystal SiGe island; and
   second heating the single crystal SiGe island at a temperature which permits further relaxation of the single crystal SiGe island to form a substantially relaxed, single crystal SiGe island atop a portion of the barrier layer.

2. The method of claim 1 wherein said barrier layer is a patterned barrier layer.

3. The method of claim 1 wherein said barrier layer is an unpatterned barrier layer.

4. The method of claim 1 wherein said barrier layer comprises impurity ions incorporated therein.

5. The method of claim 4 wherein said impurity ions serve to reduce the temperature at which the barrier layer allows elastic relaxation.

6. The method of claim 1 wherein said $Si_xGe_{1-x}$ layer is formed by an epitaxial growth process selected from the group consisting of low-pressure chemical vapor deposition, atmospheric pressure chemical vapor deposition, ultra-high vacuum chemical vapor deposition, molecular beam epitaxy, plasma-enhanced chemical vapor deposition, ion assisted deposition or any other similar deposition techniques.

7. The method of claim 1 further comprising forming a Si cap layer atop said $Si_xGe_{1-x}$ layer before said first heating step.

8. The method of claim 7 wherein said Si cap layer comprises epi-Si, a:Si, single or polycrystalline Si or any combination and multilayer thereof.

9. The method of claim 1 wherein said patterning includes lithography and etching.

10. The method of claim 1 wherein a surface oxide layer forms during said heating steps.

11. The method of claim 10 further comprising removing said surface oxide layer utilizing a wet chemical etch process or dry etching.

12. The method of claim 1 wherein said first heating and said second heating are both carried out in an oxidizing ambient which comprises at least one oxygen-containing gas.

13. The method of claim 12 wherein said at least one oxygen-containing gas comprises $O_2$, NO, $N_2O$, steam, ozone, air or mixtures thereof.

14. The method of claim 12 further comprising an inert gas, said inert gas being employed to dilute said at least one oxygen-containing gas.

15. The method of claim 1 wherein said second anneal is carried out in a non-oxidizing ambient comprised of the inert gases or mixtures thereof.

16. The method of claim 1 wherein said first heating is performed at a temperature of from about 900° to about 1335° C.

17. The method of claim 1 wherein said second heating is performed at a temperature of from about 1150° to about 1320° C.

18. The method of claim 1 further comprising growing an additional SiGe layer atop said substantially relaxed single crystal SiGe island.

19. The method of claim 18 further comprising forming a strained Si layer atop said additional SiGe layer.

20. The method of claim 1 further comprising forming a strained Si layer atop said substantially relaxed single crystal SiGe island.

21. The method of claim 1 wherein ions that are capable of forming defects that allow mechanical decoupling at or near said interface are implanted into said $Si_xGe_{1-x}$ layer either before of after said patterning.

22. The method of claim 21 wherein said implanting ions are hydrogen, deuterium, helium, oxygen, neon or mixtures thereof.

23. The method of claim 22 wherein said implanting ions are hydrogen ions.

* * * * *